United States Patent [19]
Kurono et al.

[11] Patent Number: 5,217,560
[45] Date of Patent: Jun. 8, 1993

[54] VERTICAL TYPE PROCESSING APPARATUS

[75] Inventors: Yoichi Kurono; Shigeru Handa, both of Tokyo, Japan

[73] Assignees: Tokyo Electron Limited, Tokyo; Tokyo Electron Sagami Limited, Kanagawa, both of Japan

[21] Appl. No.: 835,754

[22] Filed: Feb. 13, 1992

[30] Foreign Application Priority Data

Feb. 19, 1991 [JP] Japan ................................. 3-46042

[51] Int. Cl.$^5$ ............................................ H01L 21/00
[52] U.S. Cl. ................................... 156/345; 156/643; 118/723; 118/724
[58] Field of Search ................ 156/345, 643; 118/723, 118/724

[56] References Cited

U.S. PATENT DOCUMENTS 4,341,616  7/1982  Nagatomoto et al. .............. 156/345
5,015,330  5/1991  Okumura et al. .................... 156/643

FOREIGN PATENT DOCUMENTS

3102174A1 12/1981  Fed. Rep. of Germany .
57-043426   3/1982  Japan .
58-204526  11/1983  Japan .
60-137021   7/1985  Japan .
63-306629  12/1988  Japan .
1-315137   12/1989  Japan .
2-11327     1/1990  Japan .

Primary Examiner—Brian E. Hearn
Assistant Examiner—George Goudreau
Attorney, Agent, or Firm—Oblon, Spivak, McClelland, Maier & Neustadt

[57] ABSTRACT

An ashing apparatus of the vertical type comprises a reaction tube erected in the vertical direction to house therein a plurality of semiconductor wafers, an inner tube arranged in the reaction tube to enclose the semiconductor wafers and having a plurality of holes through which activated radicals in plasma can be selectively passed, a reaction gas supply pipe for supplying reaction gases into a space between the reaction tube and the inner tube, and plasma generating electrode unit located outside the reactor tube to generate plasma of the reaction gases only in the space between the reaction tube and the inner tube.

13 Claims, 3 Drawing Sheets

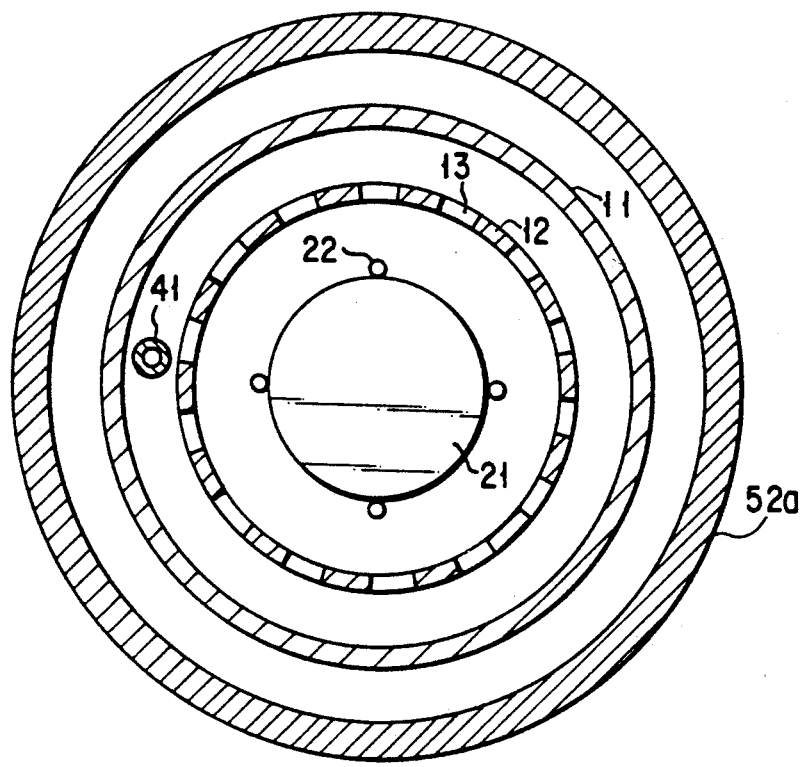
F I G. 2
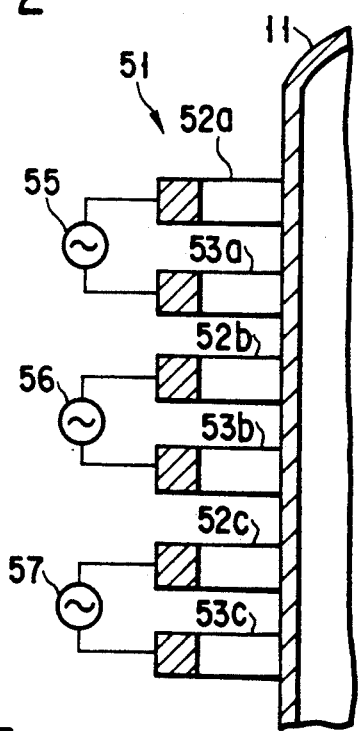
F I G. 3

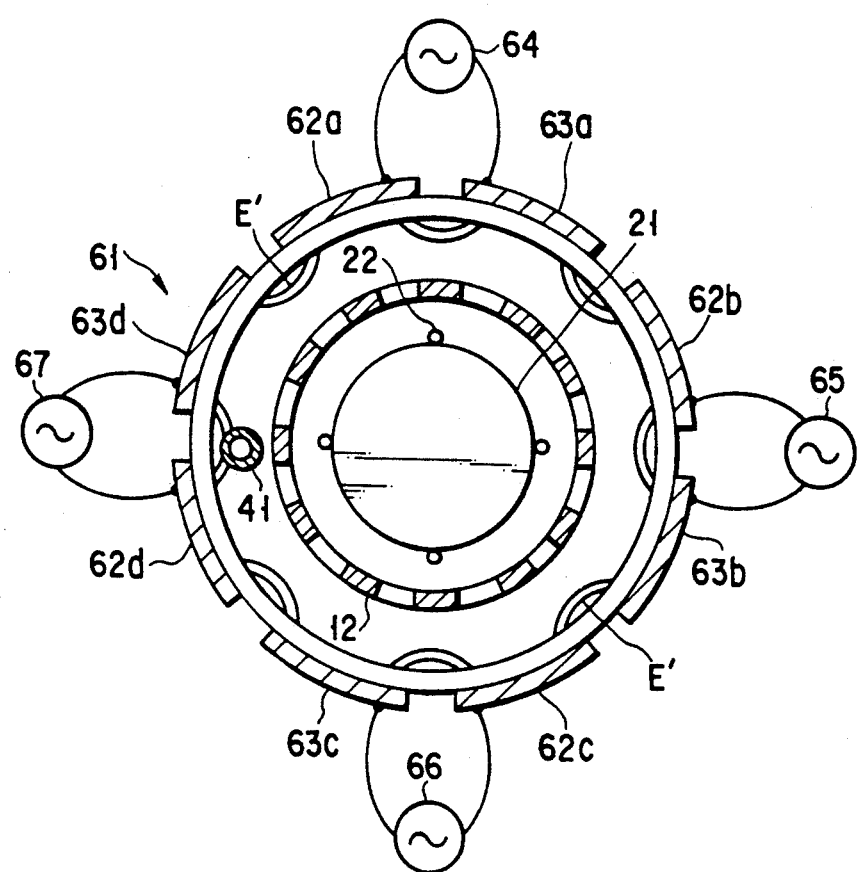
F I G. 4
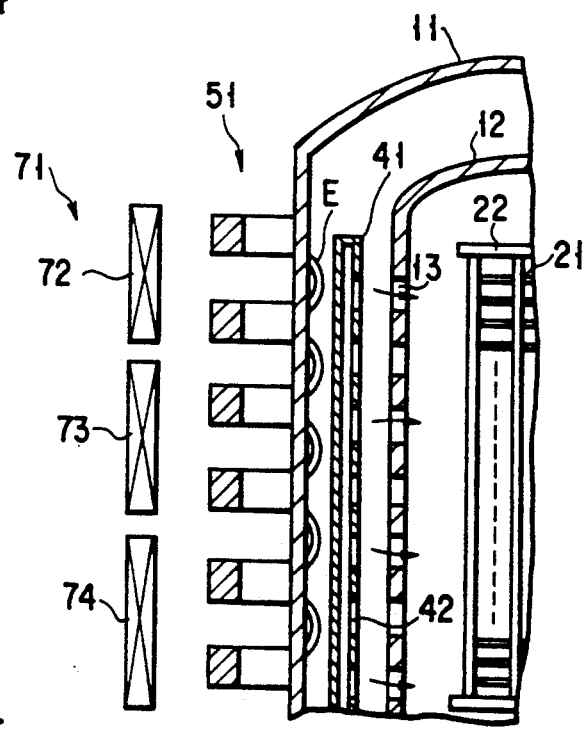
F I G. 5

VERTICAL TYPE PROCESSING APPARATUS

BACKGROUND OF THE INVENTION

1. Field of the Invention

The present invention relates to a vertical type processing apparatus which is used to apply etching and ashing processes to matters such as semiconductor wafers.

2. Description of the Related Art

Various kinds of processes such as film forming, etching and ashing processes are usually included in the course of manufacturing semiconductor devices. Recently, in accordance with demand of increasing the density of these devices and making them more highly integrated, the use of plasma has been tried these days in these processes.

Plasma contains positive ions and electrons, and is kept neutral as a whole. Also present in plasma are activated radicals. These activated radicals are constituted by exited atoms and particles which are generated when the positive ions and electrons collide with neutral particles. Ions and activated radicals contribute to the film forming, etching and ashing processes.

Published Unexamined Japanese Patent Application No. 58-204526, for example, discloses an apparatus which uses plasma to process a plurality of wafers at once. According to this processing apparatus, the reaction tube is set horizontal and plasma process is applied to the semiconductor wafers housed vertical in the reaction tube.

In this processing apparatus, however, plasma is generated along the inner wall of the reaction tube. Plasma cannot be therefore uniformly applied to the surface of each semiconductor wafers which is located on the bottom portion of the reaction tube. Namely, a larger amount of plasma is supplied to that portion of the surface of each semiconductor wafer which is nearer to the bottom of the reaction tube. Thus, surface of each semiconductor wafer cannot be uniformly processed. Further, since the semiconductor wafers are exposed directly to plasma in this processing apparatus, ion sheath is thus formed on the portion adjacent to the surface of each semiconductor wafer, and they are sputtered by ions in plasma. The semiconductor wafers are thus damaged and the yield of the semiconductor wafers lowers.

Published unexamined Japanese Utility Model Application No. 2-11327, for example, discloses a plasma processing apparatus of the vertical type. The reaction tube is erected in this case and the wafer boat in which plurality of semiconductor wafers are horizontally stacked is loaded into the reaction tube. The plasma process is then applied to the wafers. This plasma processing apparatus includes plasma generating electrodes arranged in the reaction tube so as to enclose the wafer boat.

According to this plasma processing apparatus, each of the semiconductor wafers is positioned in the reactor tube to have an equal interval from its outer circumferential rim to the electrodes. The surface of each semiconductor wafer can be thus uniformly processed. Namely, uniform plasma process can be applied to the surface of each semiconductor wafer.

In the vertical type plasma processing apparatus, however, the plasma generating electrodes are arranged in the reaction tube. Ions in plasma, therefore, sputter the electrodes, thereby causing electrode components to enter, as impurities, into the semiconductor wafers. Even a very small amount of these impurities included in the semiconductor wafers lowers the yield of the semiconductor wafers.

SUMMARY OF THE INVENTION

The present invention is therefore intended to eliminate the above-mentioned drawbacks and the object of the present invention is to provide a processing apparatus of the vertical type capable of preventing electrode components from entering, as impurities, into objects to be processed, also preventing the objects from being damaged by plasma, and applying uniform process to the objects.

The present invention provides a processing apparatus comprising a reaction tube erected in the vertical direction to house therein a plurality of objects to be processed; an inner tube arranged in the reaction tube to enclose the objects to be processed and having a plurality of holes through which activated radicals in plasma can be selectively passed; a means for supplying reaction gas into a space between the reaction tube and the inner tube; and an electrode means located outside the reaction tube to generate plasma of the reaction gases only in the space between the reactor and the inner tube.

According to this vertical type processing apparatus, since the plasma electrode means is located outside the reaction tube in plasma do not sputter the electrodes thereby preventing the yield of semiconductor wafers from being lowered. In addition, since the electrodes generate plasma of the reaction gas only in the space between the reaction tube and the inner tube and the plural holes of the inner tube are formed to allow activated radicals in plasma to be passed through them, it is substantially prevented that ions are supplied to the objects to be processed. Therefore, the objects to be processed react only with activated radicals, and are thereby enabling the process in which damaging the objects is minimized. Further, since the apparatus is of the vertical type, a more uniform process can be applied to the objects.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a cross-sectional view showing the processing apparatus of the vertical type in FIG. 1;

FIG. 3 shows another manner of connecting the plasma generating electrodes to high frequency power supplies;

FIG. 4 shows another example of the plasma generating electrodes; and

FIG. 5 is a vertically-sectional view showing the vertical type processing apparatus according to another embodiment of the present invention.

DETAILED DESCRIPTION OF THE PREFERRED EMBODIMENTS

Figure 1:
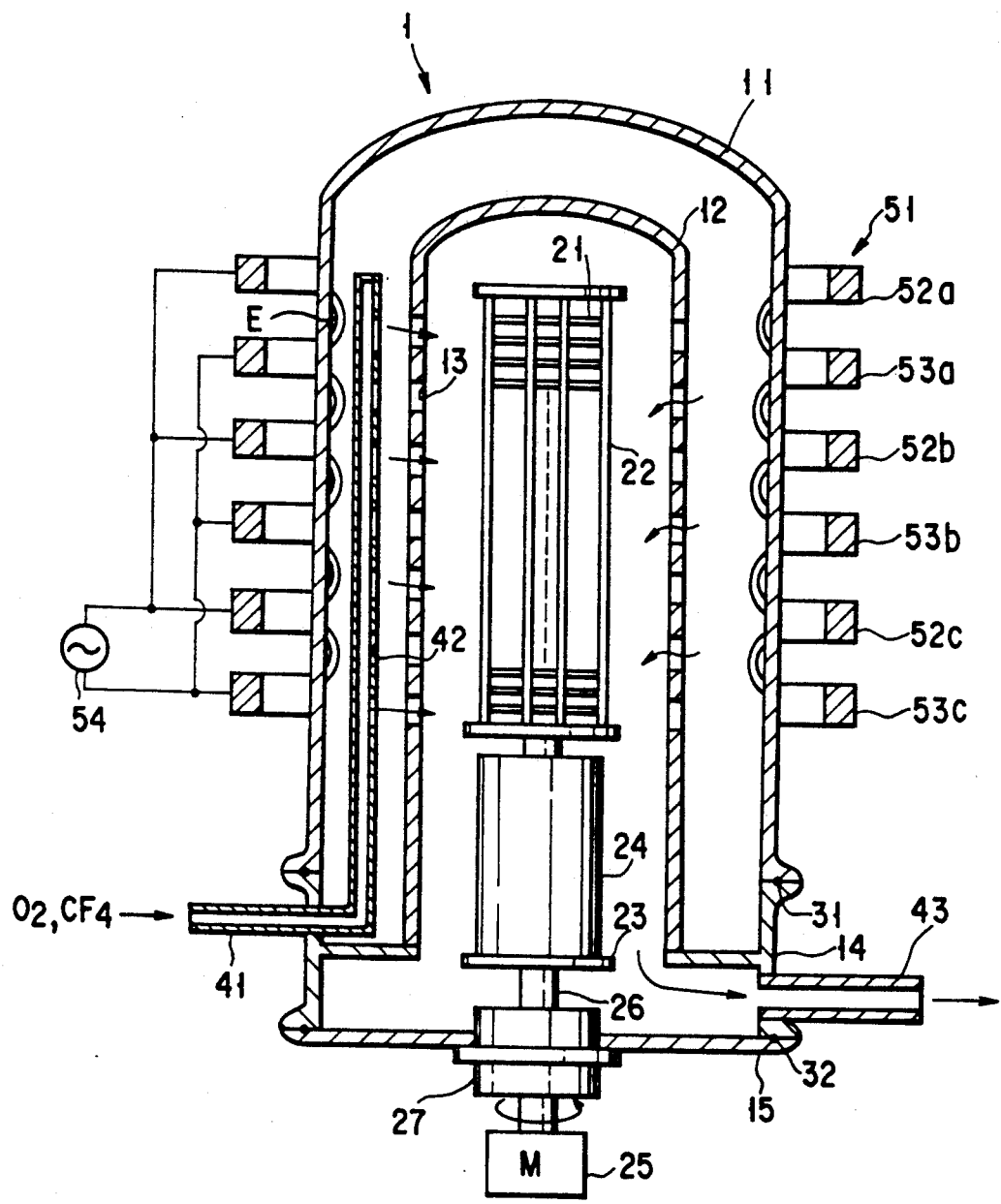
FIG. 1 is a vertically-sectional view showing the the vertical type processing apparatus according to an embodiment of the present invention.

Embodiments of the present invention will now be explained with reference to the accompanying drawings.

FIG. 1 is a vertically-sectional view showing the vertical type processing apparatus according to an embodiment of the present invention and FIG. 2 is a cross sectional view showing the same processing apparatus as shown in FIG. 1. In present embodiments, the vertical type processing apparatus of the present invention is applied to the ashing apparatus. The ashing apparatus 1 includes a cylindrical reaction tube 11 vertically erected and having a closed top. An cylindrical inner tube 12 also having a closed top is housed in the reaction tube 11. The inner tube 12 is arranged concentric with the reactor tube 11, having a certain interval to the reaction tube 11. The vertical type ashing apparatus 1, therefore, has a double-tube structure. These tubes 11 and 12 are made of heat resistant material such as quartz.

As shown in FIGS. 1 and 2, the inner tube 12 has a plurality of holes 13 all over the side wall thereof. The holes 13, as described latter, are formed as that activated radicals alone in plasma of reaction gases to selectively pass through them. The diameter of holes 13 is set such value that the value have specified relation to the thickness of the inner tube 12 and pressure in the reaction tube 11. In other words, the condition under which ions in the plasma are not allowed to pass through them is determined by these three values that is, the thickness of the inner tube 12, pressure in the reaction tube 11, and the diameter of holes 13, and their diameter is therefore set 5.0 mm when the inner tube 12 is a thickness of 4 mm and the reactor tube 11 has an internal pressure of 0.2 Torr, for example. In this embodiment, the holes 13 are formed all over the side wall of inner tube 12. However, it is not necessarily needed that they are formed all over the side wall of the inner tube 12, but they may be so formed as to effectively supply activated radicals to all of semiconductor wafers housed in a wafer boat 22.

Lower ends of the tubes 12 and 11 are fixed by a manifold 14 made of stainless steel, for example. An O-ring 31 is interposed between the manifold 14 and the reaction tube 11 to enhance the sealing of the reaction tube 11.

A plurality of semiconductor wafers 21 to be processed are stacked horizontal in the wafer boat 22 of quartz at a certain pitch. The wafer boat 22 is mounted on a heat insulating sleeve 24 located on a turntable 23. The turntable 23 is attached to a rotating shaft 26 of a motor 25 which serves a drive means. When the motor 25 is switched on, the turntable 23 can be rotated together with the wafer boat 22. The rotating shaft 26 is rotatably sealed by magnetic fluid in a seal member 27 and a cap member 15 made of stainless steel, for example, is fixed to the seal member 27 to close the open bottom of the manifold 14. When the wafer boat 22 is loaded into the inner tube 12, the open bottom of the manifold 14 is air-tightly closed by the cap member 15 through an O-ring 32. The boat 22, the heat insulating sleeve 24, the turntable 23, the cap member 15, the seal member 27 and the motor 25 are moved in one unit up and down by a lifter means for example wafer elevator (not shown). When the wafer boat 22 is to be unloaded from the reactor tube 11, they are moved down by the lifter means and when it is to be loaded into the reaction tube 11 again, they are moved up by the lifter means.

A reactive gas pipe 41 for introducing reaction gases into the reaction tube 11 is located between the reactor 11 and the inner tube 12. The reactive gas pipe 41 is hook-shaped, passing through the side wall of the manifold 14 and then extending vertical between the reactor 11 and the inner tube 12. Its vertically-extending portion has a plurality of gas outlet holes 42 facing the inner tube 12. These holes 42 are formed on the region thereof corresponding to the range in which the wafers 21 are stacked in the wafer boat 22. Reaction gas such as $O_2$ and $CF_4$ supplied from reaction gas-supply sources (not shown) are introduced into the reaction tube 11 through the gas outlet holes 42.

An exhaust pipe 43 is located on that side wall of the manifold 14 which is opposed to the reactive gas pipe 41. A vacuum pump (not shown) which serves as an exhaust means is connected to the exhaust pipe 43. The reaction tube 11 is evacuated vacuum by the vaccum pump through the exhaust pipe 43.

A plasma generating electrode unit 51 is arranged outside the reaction tube 11. The plasma generating electrode unit 51 comprises six ring-shaped electrodes 52a, 52b, 52c, 53a, 53b and 53c coaxially enclosing that portion of the reaction tube 11 which corresponds to the wafer-arranged region 22 and arranged in certain pitch. Electrodes 52a, 52b and 52c are connected to a terminal of a high frequency power supply 54 while electrodes 53a, 53b and 53c to another terminal of the high frequency power supply 54. Three pairs of electrodes are formed by these adjacent electrodes 52a and 53a, 52b and 53b, and 52c and 53c. When high frequency power is applied to these electrodes from the high frequency power supply 54, high frequency electric fields E are formed, as shown in FIG. 1, between the paired electrodes along the inner wall of the reaction tube 11. Plasma of reaction gases are thus generated in the evacuated space between the reaction tube 11 and the inner tube 12 by these electric fields E. Although three pairs of electrodes are shown in FIG. 1 for the sake of clarity, it is preferable that more pairs of electrodes are provided to uniformly apply plasma to all of the wafers 21 stacked in the wafer boat 22.

It will be described how the ashing apparatus arranged as described above is operated.

A plurality of the semiconductor wafers 21 are housed in the wafer boat 22, which is then mounted on the unloaded heat insulating sleeve 24. The wafer boat 22 is lifted together with the heat insulating sleeve 2 by the lifter means (not shown) and loaded into the inner tube 12. At the same time, the open bottom of the manifold 14 is air-tightly closed by the cap member 15.

While rotating the wafer boat 22 by the motor 25, the reaction tube 11 (is evacuated through the exhaust pipe 43 by the vacuum camp (not shown). At the same time, reaction gases such as $O_2$ and $CF_4$ are introduced into the reaction tube 11 through the reaction gas pipe 41 at a flow rate of 100 SCCM. Gas pressure in the reaction tube 11 is kept in range of 0.1 to 1.0 Torr, preferably at about 0.5 Torr during the ashing process.

Right after the introduction of reactive gases into the reaction tube 11, high frequency power is applied from the high frequency power supply 54 to the ring-shaped electrodes 52a, 52b, 52c, 53a, 53b and 53c of the plasma generating electrode unit 51. High frequency electric fields E are thus formed along the inner wall of the reaction reactor tube 11 and plasma of the reaction gases is generated between the reaction tube 1 and the inner tube 12 by these electric fields E. $CF_4$ gas supplied is dissociated in the plasma according to the following chemical formula, thereby creating activated radicals $F^*$.

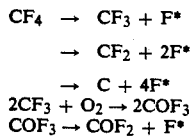

Ions are also present in addition to the activated radicals in the plasma thus generated. The ions in the plasma are attracted onto the charged-up inner tube 12 not to pass through the holes 13 of the inner tube 12. They annihilate while colliding with the inner tube 12 several times. The ions can be thus prevented from directly reaching the semiconductor wafers 21, and the activated radicals alone selectively pass through the holes 13 of the inner tube 12 to reach the semiconductor wafers 21. The activated radicals then react with photoresist on each of the semiconductor wafers. The ashing process can be thus achieved.

The gas which has contributed to the ashing process in this manner is exhausted outside the reactor tube 11 through the exhaust pipe 43.

As described above, since the ions in the plasma can be prevented from directly reaching the semiconductor wafers. It is prevented that defects of the semiconductor wafers are formed by the sputtering of the ions. In other words, when the above-described ashing apparatus is used, the semiconductor wafers can be reliably separated from the plasma generating area in the reaction tube and the ashing process can be achieved without damaging the semiconductor wafers.

When the ashing apparatus is embodied as described above, the activated radicals can be applied to each of the semiconductor wafers in such a way that they flow from the circumferential rim to the center of it. The semiconductor wafers can be thus uniformly processed.

Further, since the plasma generating electrode unit 51 is located outside the reactor tube 11, material of the electrodes can be thus prevented from entering as impurities into the semiconductor wafers, thereby enhancing the yield of the semiconductor wafers to greater extent.

Although high frequency power has been applied from one high frequency power supply to the ring-shaped electrodes 52a, 52b, 52c, 53a, 53b and 53c of the plasma generating electrode unit 51 in the above case, the three paired electrodes may be connected to three power supplies 55, 56 and 57, respectively, as shown in FIG. 3. More specifically, it may be arranged that the ring electrode 52a is paired with the ring electrode 53a, 52b with 53b and 52c with 53c and that these pairs of the electrodes 52a and 53a, 52b and 53b, and 52c and 53c are connected to power supplies sources 55, 56 and 57, respectively. FIG. 3 shows only the electrodes and the power supplies, but other portions of the ashing apparatus is same in structure as that shown in FIG. 1.

When the ashing apparatus is embodied as described above, the plasma generating area in the reaction tube 11 can be divided into three zones in the vertical direction, and voltage supplied to each pair of the electrodes can be adjusted, therefore, Therefore, processing conditions can be changed every zone of the plasma generating area in the reaction tube. Therefore, even when ununiformity of processing in the surface of each semiconductor wafer or among the semiconductor wafers is appeared because of ununiformity of the reaction gas supplied or because of the difference of the amount of the activated radicals between on the upstream side of the gas flow and on the downstream side thereof, all of the semiconductor wafers can be uniformity processed by means of appropriately setting processing conditions of each zone. The processing conditions of each zone can be set by adjusting the power supplied to each pair of the electrodes of adjusting the time during which the power is supplied to each pair of electrodes. The following is a case where the power and the time are adjusted every zone of the plasma generating area in the reaction tube.

1) High Frequency Power Adjusted

Power supplied to the paired electrodes 52a and 53a—100%

Power supplied to the paired electrodes 52b and 53b—90%

Power supplied to the paired electrodes 52c and 53c—80%

2) Time Adjusted

Time during which power is supplied to the paired electrodes 52a and 53a—100 minutes Time during which power is supplied to the paired electrodes 52b and 53b—90 minutes Time during which power is supplied to the paired electrodes 52c and 53c—80 minutes When member of the semiconductor wafers to be processed is few, occupying only a part of the wafer boat, high frequency power may be supplied only to that pair of the electrodes corresponding to the portion of the wafer boat in which the semiconductor wafers are mounted. When the semiconductor wafers are housed only in the center portion of the wafer boat, for example, the ashing process can be applied to the semiconductor wafers while supplying high frequency power only to the middle pair of the electrodes 52b and 53b.

Three pairs of the electrodes are shown in FIG. 3 similar to FIG. 1. In order to uniformly form the plasma at the wafer-arranged area in the inner tube, however, it is preferable that more pairs of the electrodes are provided. As they become more and more, the interval between them becomes smaller. This enables more uniform plasma to be formed.

Although the ring-shaped electrodes have been used as plasma generating electrodes in the above-described cases, plural plate-shaped electrodes each having an arc section may be erected along the circumference of the reaction tube 11, as shown in FIG. 4. An electrode unit 61 in FIG. 4 comprises plate-shaped electrodes 62a, 63a, 62b, 63b, 62c, 63c, 62d and 63d. The electrode 62a is paired with the electrode 63a, 62b with 63b, 62c with 63c, and 62d with 63d, and these pairs of the electrodes are connected to high frequency power supplies 64, 65, 66 and 67, respectedly. When high frequency power is supplied from these high frequency power supplies to the pairs of the electrodes, high frequency electric fields $E'$ are formed along the inner wall of the reaction tube 11 to generate plasma of reaction gases between the reactor 11 and the inner tube 12.

Although the present invention has been applied to the ashing apparatus in the above cases, it can be applied to other processing apparatus such as a plasma etching apparatus and a plasma CVD apparatus.

Particularly when the present invention is applied to the plasma CVD apparatus, it is preferable that a heater unit 71 for heating the semiconductor wafers is located outside the reaction tube 11 as shown in FIG. 5. It is also preferable that the heater unit 71 is divided into three zones which include heaters 72, 73 and 74, respectively, as shown in FIG. 5. When plural heater zones are provided in this manner, the heating of the semiconductor wafers can be adjusted every zone.

Although the objects to be processed have been semiconductor wafers in the above cases, the present invention can be applied to those apparatuses which are used to process LCD substrates and others.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A vertical type processing apparatus, comprising:
   a reaction tube erected in the vertical direction to house therein a plurality of objects to be processed;
   an inner tube arranged in the reaction tube to enclose the objects to be processed and having a plurality of holes through which activated radicals in plasma can be selectively passed;
   a plurality of pairs of high frequency electrodes arranged outside the reaction tube; and
   a means for supplying reaction gas into a space between the reaction tube and the inner tube;
   wherein said high frequency electrodes forming each pair are disposed adjacent to each other, and a high frequency electric field is formed between the reaction tube and the inner tube when a high frequency power is supplied to a space between the paired electrodes so as to generate a plasma of the reaction gas only in the space between the reaction tube and the inner tube.

2. The processing apparatus according to claim 1, wherein each of said paired electrodes is ring-shaped to coaxially enclose the reaction tube.

3. The processing apparatus according to claim 2, wherein each pair of the electrodes is connected to its corresponding power supply.

4. The processing apparatus according to claim 2, wherein each pair of the electrodes is divided along a vertical length of the reaction tube into a plurality of sections, and power and a power-supplying time are set independently for each section.

5. The processing apparatus according to claim 2, wherein each pair of the electrodes is divided along a vertical length of the reaction tube into a plurality of sections, and an on-off operation for the power application is performed independently for each section.

6. The processing apparatus according to claim 1, wherein each of said paired electrodes is erected along the outer circumference of the reaction tube.

7. The processing apparatus according to claim 1, wherein said reaction gas supply means has a gas supply pipe vertically extending in the space between the reaction tube and the inner tube.

8. The processing apparatus according to claim 7, wherein the gas supply pipe has a plurality of gas outlet holes facing the inner tube.

9. The processing apparatus according to claim 1, wherein each of the objects to be processed has a plate-like body and the objects are stacked horizontal in a support member.

10. The processing apparatus according to claim 9, further comprising a means for rotating the support member.

11. The processing apparatus according to claim 1, further comprising a means for heating interior of the reaction tube.

12. The processing apparatus according to claim 11, wherein said heating means are divided into plural heating zones in the vertical direction.

13. The processing apparatus according to claim 1, wherein said inner tube is formed of quartz.

* * * * *